(12) United States Patent  (10) Patent No.: US 7,057,207 B2
Lai  (45) Date of Patent: Jun. 6, 2006

(54) THIN FILM TRANSISTOR ARRAY AND REPAIRING METHOD THEREOF

(75) Inventor: Han-Chung Lai, Taoyuan Hsien (TW)

(73) Assignee: Au Optronics Corporation, Hsinchu (TW)

( * ) Notice: Subject to any disclaimer, the term of this patent is extended or adjusted under 35 U.S.C. 154(b) by 40 days.

(21) Appl. No.: 10/710,198

(22) Filed: Jun. 25, 2004

(65) Prior Publication Data

US 2005/0253145 A1   Nov. 17, 2005

(30) Foreign Application Priority Data

Apr. 23, 2004   (TW) .............................. 93111378 A

(51) Int. Cl.
*H01L 29/04* (2006.01)
*H01L 31/20* (2006.01)
(52) U.S. Cl. .............................. 257/57; 257/59; 257/72
(58) Field of Classification Search .................. 257/57, 257/59, 72
See application file for complete search history.

(56) References Cited

U.S. PATENT DOCUMENTS 5,298,891 A * 3/1994 Plus et al. ..................... 345/93
6,191,832 B1 * 2/2001 Nakakura ..................... 349/54

* cited by examiner

*Primary Examiner*—Phat X. Cao
*Assistant Examiner*—Theresa T. Doan
(74) *Attorney, Agent, or Firm*—Jianq Chyun IP Office

(57) ABSTRACT

A repairing method of thin film transistor array is provided. The repairing method of thin film transistor array can remove a residue between pixel electrodes so as to prevent the residue from electrically connecting pixel electrodes adjacent to each other. The repairing method of thin film transistor array can also be provided to remove a portion of the pixel electrodes above a particle or a defect, which may cause leakage of a storage capacity. The parameters of repairing method of the thin film transistor array precisely controlled and the yield of the thin film transistor array can be effectively improved.

4 Claims, 6 Drawing Sheets

THIN FILM TRANSISTOR ARRAY AND REPAIRING METHOD THEREOF

CROSS REFERENCE TO RELATED APPLICATIONS

This application claims the priority benefit of Taiwan application serial no. 93111378, filed Apr. 23, 2004.

BACKGROUND OF INVENTION

1. Field of the Invention

The present invention relates to a thin film transistor array (TFT array) and repairing method thereof. More particularly, the present invention relates to a thin film transistor array (TFT array) and repairing method thereof, which can significantly improve yields of a repair process.

2. Description of Related Art

The proliferation of multi-media systems in our society depends on development of semiconductor devices and display devices. Display devices such as the cathode ray tube (CRT) have been used for quite some time due to its remarkable display quality, reliability and low costs. Although the conventional CRT has many advantages, the design of the electron gun renders it heavy, bulky and energy wasting. Moreover, there is always some potential danger of hurting viewer's eyes due to its emission of some radiation. With big leaps in the techniques of manufacturing semiconductor devices and opto-electronics devices, high picture quality, slim, low power consumption and radiation-free displays such as the thin film transistor liquid crystal displays (TFT-LCD) have gradually become mainstream display products.

Generally, a color TFT-LCD includes a color filter (C/F), a TFT array and a liquid crystal layer disposed therebetween. The TFT array includes a plurality of thin film transistors, which are arranged in an area array and are connected with a plurality of scan lines and data lines. Each thin film transistor is disposed in a pixel area and is electrically connected to a corresponding pixel electrode formed by indium tin oxide (ITO), indium zinc oxide (IZO) or other transparent conductive materials. Each thin film transistor is used to drive the liquid crystal layer to show various gray levels. Furthermore, in a pixel of the conventional TFT array, a storage capacitor (Cst) may be formed between a pixel electrode, the corresponding scan line and a dielectric layer. (e.g. a gate insulating layer and/or a passivation layer) Also, the storage capacitor (Cst) can be formed between a pixel electrode, a common line and a dielectric layer to provide better picture quality.

However, during a patterning process of the pixel electrodes of the conventional TFT array, two adjacent pixel electrodes may abnormally connect to each other because of an ITO or IZO residue therebetween. Furthermore, particles or defects within the dielectric layer of the storage capacitor resulting from contamination may cause the leakage between an upper electrode and a bottom electrode of the storage capacitor. The particles or defects make pixels display abnormally and the picture quality of the display is degraded. In order to resolve the problems mentioned above, a laser welding process between the upper electrode and the bottom electrode of a defective storage capacitor is performed to darken a defective pixel. It is noted that the number of the dark defects is increased because the laser welding process mentioned above is performed.

SUMMARY OF INVENTION

The present invention is directed to a thin film transistor array, wherein leakage between an upper electrode and a bottom electrode of a storage capacitor resulting from particles or defects can be reduced so that yield of the manufacturing processes can be improved.

The present invention is directed to a repairing method of a thin film transistor array comprising a step of removing a residue, which may cause an abnormal electrical connection between pixel electrodes.

The present invention is directed to a repairing method of a thin film transistor array comprising a step of removing a portion of a pixel electrode above particles or defects for reducing leakage between an upper electrode and a bottom electrode of a storage capacitor resulting from the particles or defects.

The present invention is directed to a repairing method of a thin film transistor array comprising a step of applying pulse beams to reduce the damage probability of the neighboring devices, wherein the energy of the pulse beams can be controlled and fine tuned precisely to improve yield of the manufacturing processes.

The present invention is directed to a film removing method comprising a step of applying pulse beams, wherein the energy of the pulse beams can be controlled and fine tuned precisely to improve yield of the manufacturing processes.

According to an embodiment of the present invention, the thin film transistor array comprising a substrate, a plurality of scan lines, a plurality of data lines, a plurality of thin film transistors and a plurality of pixel electrodes is provided. The scan lines and the data lines are disposed over the substrate and the substrate is defined into a plurality of pixel areas by the scan lines and the data lines. Each thin film transistor is disposed in one of the pixel areas and is connected with the scan lines and the data lines correspondingly. Each pixel electrode is disposed in one of the pixel areas and is electrically connected to one of the thin film transistors correspondingly. A portion of each pixel electrode is located above one of the scan lines to form a storage capacitor, and one of the scan lines and a defect pixel electrode of the pixel electrodes have a particle or a defect therebetween wherein the defect pixel electrode further comprises an opening corresponding to the particle or the defect. Therefore, the leakage of the defective storage capacitor can be reduced.

According to an embodiment of the present invention, the thin film transistor array including a substrate, a plurality of scan lines, a plurality of data lines, a plurality of thin film transistors, a plurality of pixel electrodes and a plurality of common lines is provided. The scan lines and the data lines are disposed over the substrate and the substrate is defined into a plurality of pixel areas by the scan lines and the data lines. Each thin film transistor is disposed in one of the pixel areas and is connected with the scan lines and the data lines correspondingly. Each pixel electrode is disposed in one of the pixel areas and is electrically connected to one of the thin film transistors correspondingly. The common lines are disposed over the substrate and a portion of each common line is located above one of the common lines to form a storage capacitor, and one of the common lines and a defect pixel electrode of the pixel electrode have a particle or a defect therebetween, wherein the defect pixel electrode further comprises an opening corresponding to the particle or the defect. Therefore, the leakage of the defect storage capacitor can be reduced.

In an embodiment of the present invention, the thin film transistor array further comprises a dielectric layer disposed between the pixel electrodes and the scan lines or between the pixel electrodes and the scan lines.

According to an embodiment of the present invention, the method for repairing a thin film transistor array having a plurality of pixel electrodes is provided, wherein the pixel electrodes are electrically connected to each other through a residue therebetween. The repairing method, according to the present embodiment of the present invention, comprises a step of applying at least one pulse beam having a pulse duration between 1/20 of a second and 1/4 of a second onto the residue to remove at least a portion of the residue such that the pixel electrodes adjacent to the residue are electrically isolated.

According to an embodiment of the present invention, the invention provides a method of repairing a thin film transistor array having a plurality of storage capacitors over scan lines (Cst on gate) or over common lines (Cst on common), wherein a pixel electrode and one of the scan lines or one of the common lines corresponding to the pixel electrode have a particle or a defect therebetween. The repairing method comprises a step of applying at least one pulse beam having a pulse duration between 1/20 of a second and 1/4 of a second onto the pixel electrode to remove at least a portion of the pixel electrode above the particle or the defect.

In the repairing method, according to an embodiment of the present invention, the pulse duration is, for example, between 1/11 of a second and 1/4 of a second, and the preferred pulse duration is 0.1 second. Furthermore, the pulse beam may be a pulse laser beam with wavelength between 300 nm and 500 nm.

According to an embodiment of the present invention, the film removing method suitable for removing a film formed over a thin film transistor array is provided. The film removing method comprises a step of applying at least one pulse beam having a pulse duration between 1/20 of a second and 1/4 of a second onto the film to remove at least a portion of the film.

In the film removing method of the present invention, the pulse duration is, for example, between 1/11 of a second and 1/4 of a second, and the preferred pulse duration is 0.1 second. Furthermore, the pulse beam may be a pulse laser beam with wavelength between 300 nm and 500 nm.

In the repairing method, according to an embodiment of the present invention, the residue between pixel electrodes is removed for reducing abnormal electrical connection between two adjacent pixel electrodes. Moreover, the repairing method of the TFT array may also comprises a step of removing a portion of the pixel electrode above the particles or defects to ensure that the storage capacitor can operate consistently. Since the repairing method is performed with the pulse beams, which can be controlled and fine-tuned, the residue above devices can be precisely removed so as to improve yield of the manufacturing processes.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
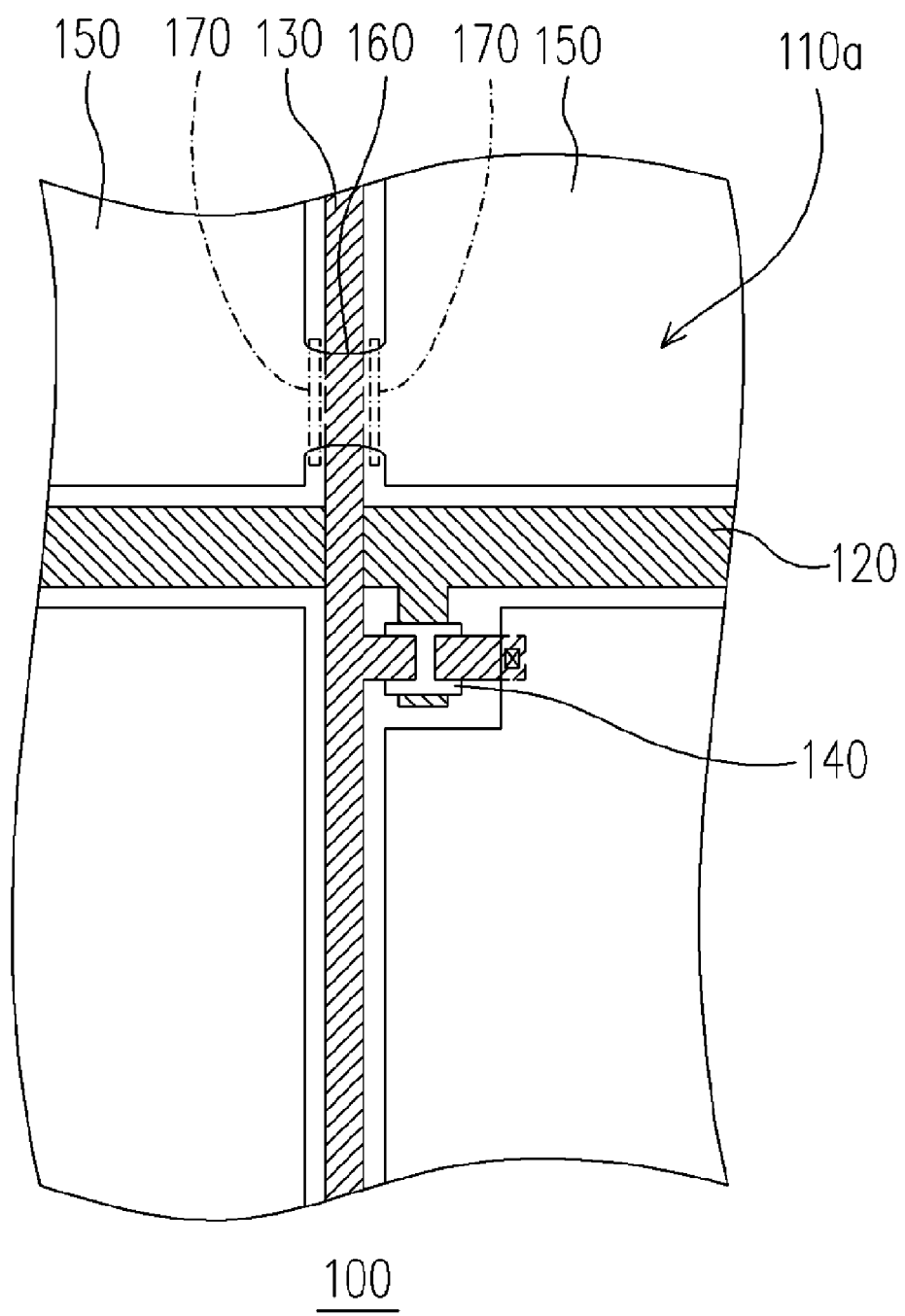
FIG. 1 and FIG. 2 are top views of a thin film transistor array according to an embodiment of the present invention.

FIG. 1 is a top view of a thin film transistor array according to an embodiment of the present invention. Referring to FIG. 1, a thin film transistor array 100, according to an embodiment of the present invention, comprises a substrate 110 (shown in FIG. 3B), a plurality of scan lines 120, a plurality of data lines 130, a plurality of thin film transistors 140 and a plurality of pixel electrodes 150. The scan lines 120 and the data lines 130 are disposed over the substrate 100 and the substrate 100 is defined into a plurality of pixel areas 110a by the scan lines 120 and the data lines 130. Each thin film transistor 140 is disposed in one of the pixel areas 110a and is connected with the scan lines 120 and the data lines 130 correspondingly. Furthermore, each pixel electrode 150 is disposed in one of the pixel areas 110a and is electrically connected to one of the thin film transistors 140 correspondingly. In an embodiment of the present invention, the material of the pixel electrode 150 includes transparent conductive material, such as indium tin oxide (ITO) or indium zinc oxide. In order to simplify the drawings, only few elements are described with reference to FIG. 1. In fact, the thin film transistor array 100 further comprises storage capacitors having a Cst over scan lines (Cst on gate) or a Cst over common lines (Cst on common).

Referring FIG. 1, during the patterning process of the pixel electrodes 150, a residue 160, such as an ITO residue or an IZO residue, may remain between above the data lines 130. In this regard, the pixel electrodes 150 adjacent to the data line 130 may be electrically connected to each other through the residue 160. Therefore, the thin film transistor array 100 cannot operate regularly. For this reason, the present invention provides a repairing method of the thin film transistor array 100 to resolve the problem resulted from the residue 160.

As shown in FIG. 1, the repairing method of the thin film transistor array 100 comprises a step of applying at least one pulse beam having a pulse duration between 1/20 of a second and 1/4 of a second onto an joint area 170 between the residue 160 and the pixel electrodes 150. Therefore, the pixel electrodes 150 adjacent to the residue 160 are electrically isolated from each other. However, in another embodiments of the present invention, the residue 160 may be entirely or partially removed. Furthermore, except for the joint area 170, other portions of the residue 160 may be removed to electrically isolate the pixel electrodes 150. Moreover, the pulse duration of the pulse beam is, for example, between 1/20 of a second and 1/4 of a second. In an embodiment of the present invention, the pulse duration is, for example, between 1/11 of a second and 1/4 of a second, and the preferred pulse duration is about 0.1 second. Furthermore, the pulse beam is, for example, a pulse laser beam with wavelength between 300 nm and 500 nm.

It should be noted that the pulse duration mentioned above is an action period of each pulse beam. In other words, if the pulse duration of the pulse beam is T, an F value of the pulse beam is equal to 1/T. During the actual operation, the pulse duration and the frequency (i.e. shots per second, but not the F value) of the pulse beam determine a total action period. For example, when the pulse duration of the pulse beam is 0.1 second (i.e. the F value of the pulse beam is 10) and the frequency of the pulse beam is 2 (i.e. two shots per second), the total action period is 0.2 second.

In the repairing method, according to an embodiment of the present invention, the residue is removed by applying a pulse beam. Since the total action the pulse duration and the frequency of the pulse beam determine periods, precise controlling and fine-tuning of the energy of the pulse beams make possible. Therefore, the repairing operation can be performed precisely. However, the position of the residue is illustrated for describing the embodiments of the present invention, the residue may be located at any position of the thin film transistor array. For example, the residue may be located above the scan lines or the thin film transistors. By using the repairing method of the present invention, damage of circuits or devices underneath the residue caused by pulse beams having excess energy can be substantially reduced.

Figure 2:
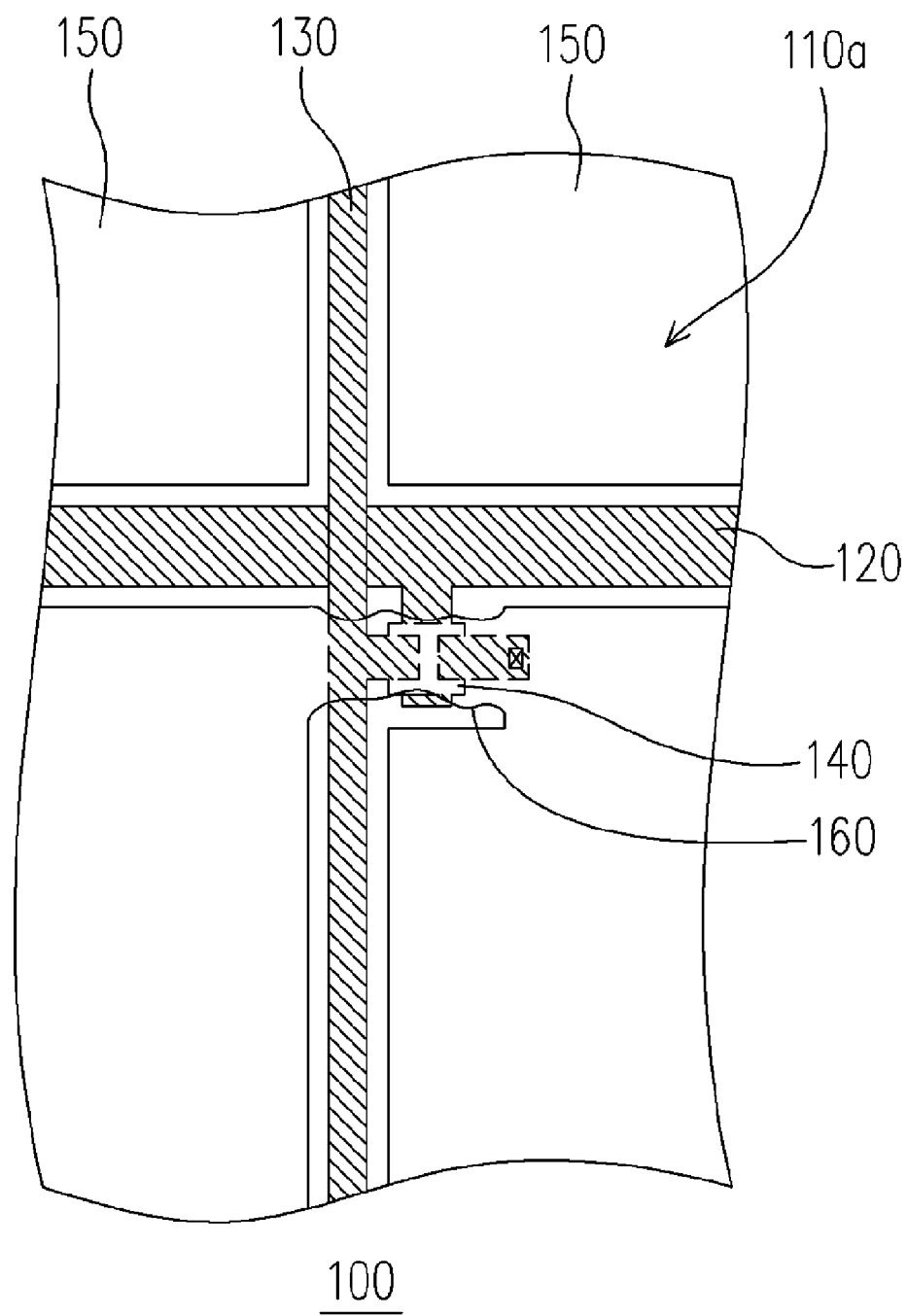

Referring to FIG. 2, the residue 160 is located above the thin film transistor 140, similarly, the residue 160 located above the thin film transistor 140 can be entirely or partially removed by the repairing method of the present invention. Therefore, the pixel electrodes 150 adjacent to the residue 160 are electrically isolated from each other. However, the repairing procedures are similar to the embodiment shown in FIG. 1, and therefore the detail description is omitted.

Figure 3A:
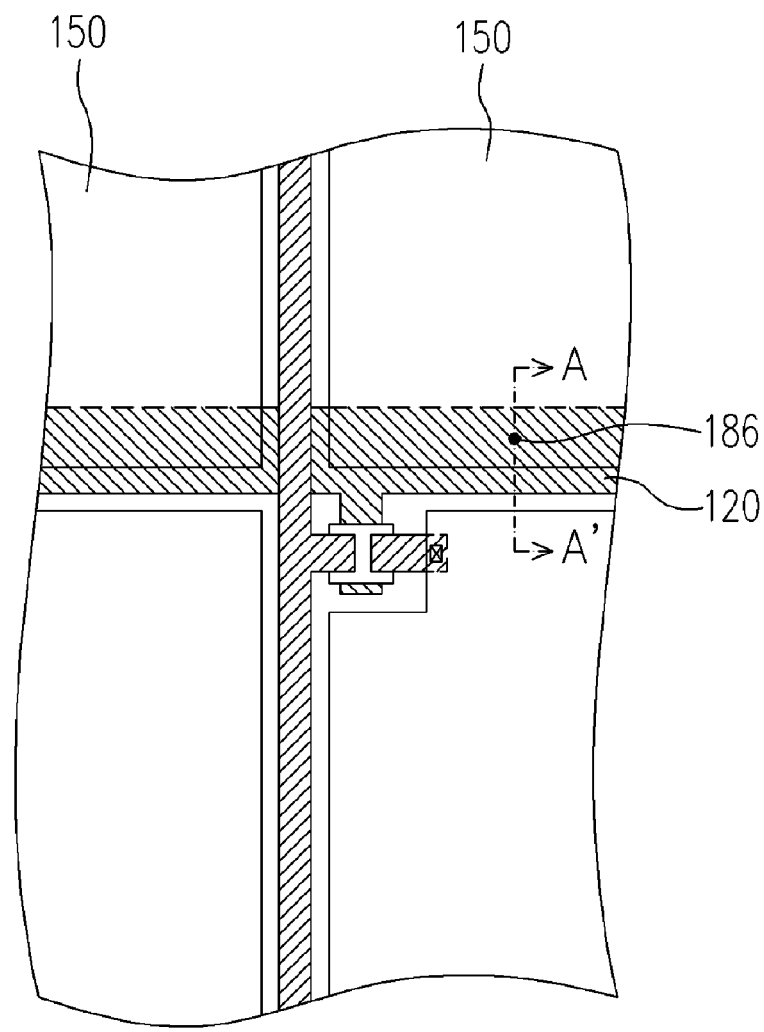
FIG. 3A is a top view of a thin film transistor array according to another embodiment of the present invention.
Figure 3B:
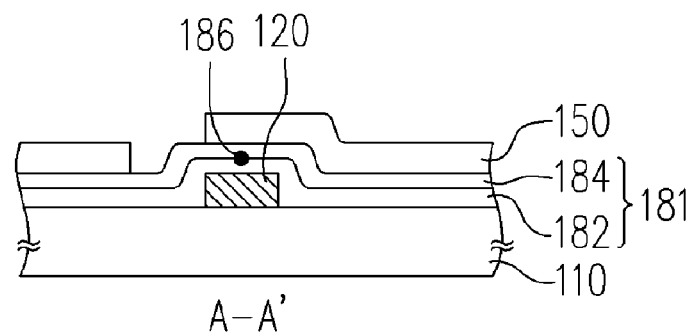
FIG. 3B is a cross-sectional view along line A–A' of FIG. 3A.

FIG. 3A is a top view of a thin film transistor array according to another embodiment of the present invention; and FIG. 3B is a cross-sectional view along line A–A' of FIG. 3A. Referring to FIG. 3A and FIG. 3B, the same reference number shown in FIG. 1, FIG. 3A and FIG. 3B represents the same element, and the detail description of which is omitted. In an embodiment of the present invention, the pixel electrode 150 extends to an area above the scan line 120. A dielectric layer 181, which comprises a gate-insulating layer 182 and a passivation layer 184 extending from the thin film transistor 140, is disposed between the pixel electrode 150 and the scan line 120. The pixel electrode 150 and the scan line 120 form a storage capacitor. Furthermore, the particles or the defects 186 resulting from contamination remains in the dielectric layer 181, and the particles or the defects 186 located between the pixel electrode 150 and the scan line 120 may result in the leakage of the storage capacitor.

Figure 4A:
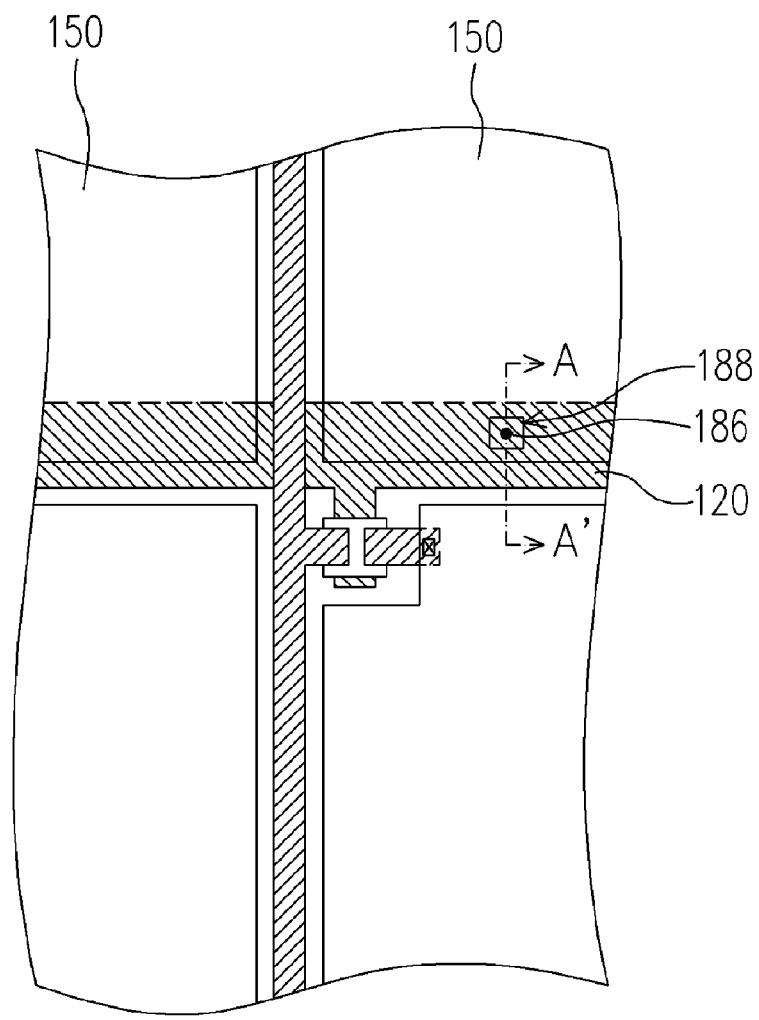
FIG. 4A and FIG. 4B are views of thin film transistor arrays shown FIG. 3A and FIG. 3B after repairing.
Figure 4B:
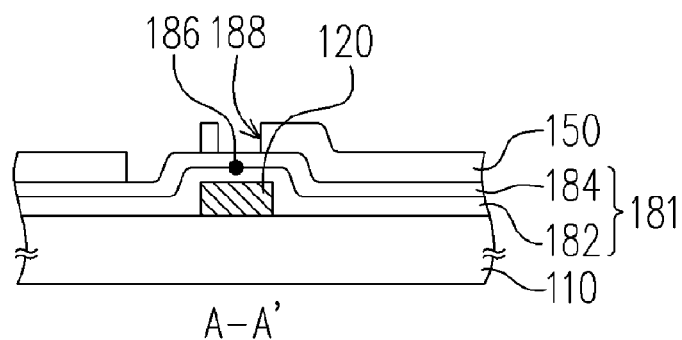

FIG. 4A and FIG. 4B are thin film transistor arrays shown FIG. 3A and FIG. 3B after repairing. Referring to FIG. 4A and FIG. 4B, in order to reduce the leakage of the storage capacitor between the pixel electrode 150 and the scan line 120, the repairing technology of the present invention is applied. In this embodiment, the pulse beams are applied onto the pixel electrode 150 to remove at least a portion of the pixel electrode 150, which is located above the particles or the defects 186, so that an opening 188 is formed above the particles or the defects 186. Therefore, the leakage of the storage capacitor resulting from the particles or the defects 186 between the pixel electrode 150 and the scan line 120 can be effectively reduced.

Figure 5A:
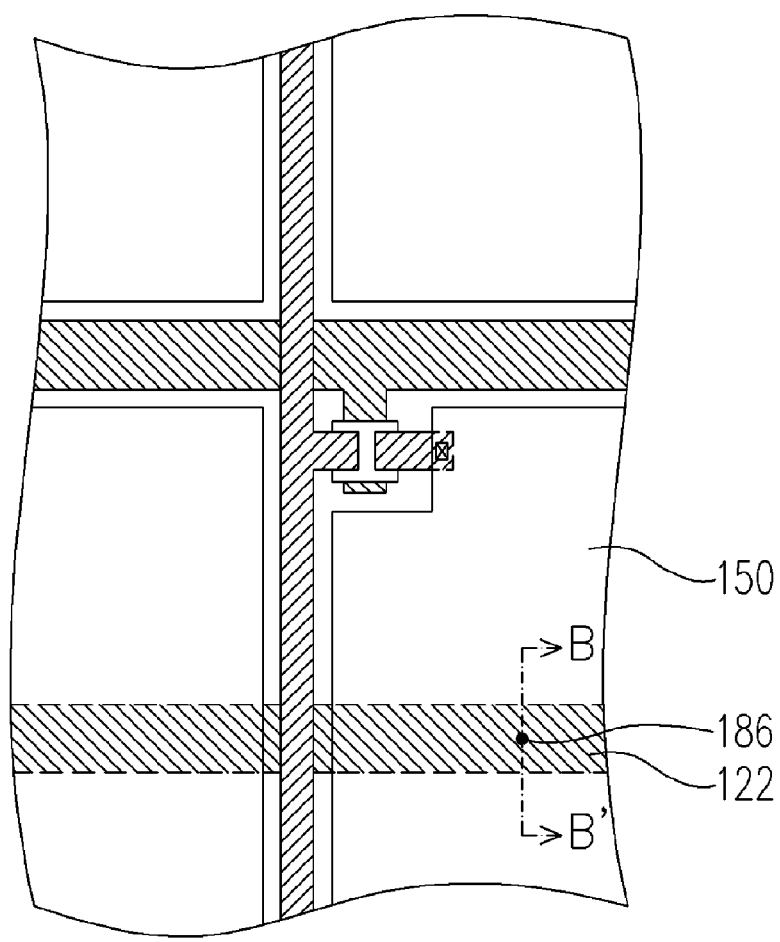
FIG. 5A is a top view of a thin film transistor array according to still another embodiment of the present invention.
Figure 5B:
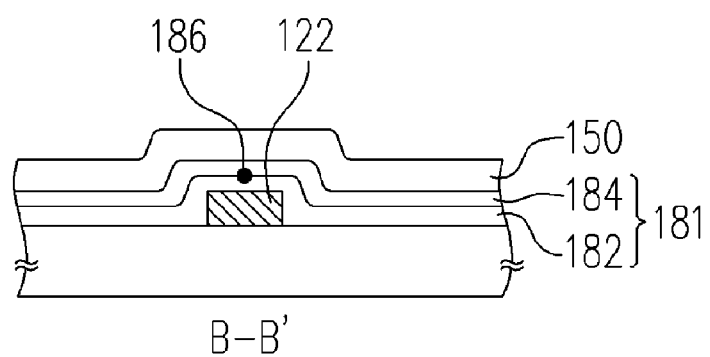
FIG. 5B is a cross-sectional view along line B–B' of FIG. 5A.

Moreover, the repairing method of the present invention can be applied to the TFT array having the Cst over common lines (Cst on common). FIG. 5A schematically shows a top view of a thin film transistor array according to still another embodiment of the present invention; and FIG. 5B is a cross-sectional view along line B–B' of FIG. 5A. Referring to FIG. 5A and FIG. 5B, the same reference number shown in FIG. 1, FIG. 5A and FIG. 5B represent the same element, and the detail description of which is omitted. In an embodiment of the present invention, a portion of the pixel electrode 150 is above the common line 122. A dielectric layer 181, which comprises a gate-insulating layer 182 and a passivation layer 184 extending from the thin film transistor 140, is disposed between the pixel electrode 150 and the common line 122. A storage capacitor is formed between the pixel electrode 150 and the common line 122. Furthermore, the particles or the defects 186 resulting from contamination remains in the dielectric layer 181, and the particles or the defects 186 located between the pixel electrode 150 and the common line 122 may result in the leakage of the storage capacitor.

Figure 6A:
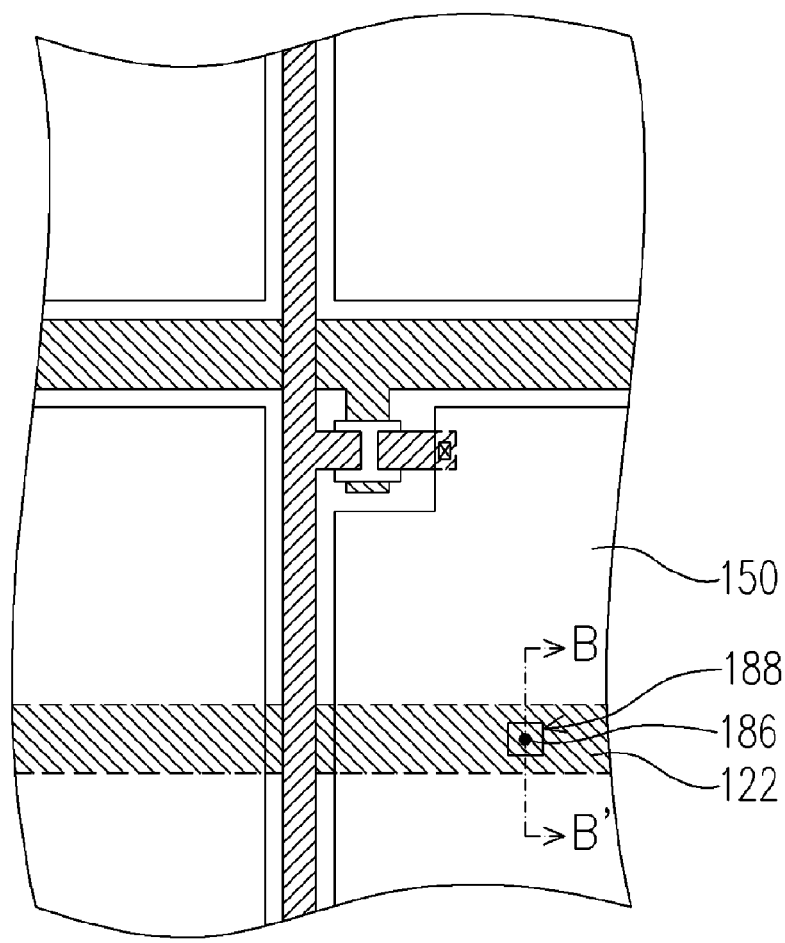
FIG. 6A and FIG. 6B are views of thin film transistor arrays shown FIG. 5A and FIG. 5B after repairing.
Figure 6B:
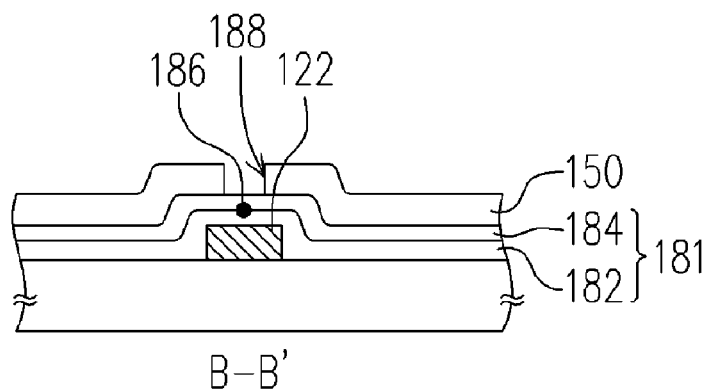

FIG. 6A and FIG. 6B are thin film transistor arrays shown FIG. 5A and FIG. 5B after repairing. Referring to FIG. 6A and FIG. 6B, in order to reduce the leakage of the storage capacitor formed between the pixel electrode 150 and the common line 122, the repairing technology of the present invention is applied. In this embodiment, the pulse beams are applied onto the pixel electrode 150 to remove at least a portion of the pixel electrode 150, which is located above the particles or the defects 186, so that an opening 188 is formed above the particles or the defects 186. Therefore, the leakage of the storage capacitor resulting from the particles or the defects 186 between the pixel electrode 150 and the common line 122 can be effectively reduced.

The TFT array and the repairing method thereof are capable of reducing abnormal electrical connection between pixel electrodes and the leakage of the storage capacitor resulting from particles or defects therein. In addition, the repairing method of the present invention comprises a step of applying pulse beams to remove thin film formed over the TFT array, wherein the energy of the pulse beams can be controlled and fine-tuned precisely, and therefore, yield of the manufacturing processes can be improved. It should be noted that the embodiments illustrated above are used to describe the present invention, and one skilled artisan would understand that the repairing method of the present invention could be applied to manufacture a patterned thin film. With appropriate modification, the repairing method of the present invention can be used remove a thin film formed over a TFT array so that the thin film anywhere can be removed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A thin film transistor array, comprising:
a substrate;
a plurality of scan lines, disposed over the substrate;

a plurality of data lines, disposed over the substrate, wherein the substrate is defined into a plurality of pixel areas by the scan lines and the data lines;

a plurality of thin film transistors, connected with the scan lines and the data lines, wherein each thin film transistor is disposed in one of the pixel areas correspondingly; and a plurality of pixel electrodes, wherein each pixel electrode is disposed in one of the pixel areas and is electrically connected to one of the thin film transistors correspondingly, a storage capacitor is formed between a portion of each pixel electrode located above one of the scan lines and the scan lines, and one of the scan lines and a defect pixel electrode of the pixel electrodes have a particle or a defect therebetween wherein the defect pixel electrode further comprises an opening corresponding to the particle or the defect.

2. The thin film transistor array of claim 1, further comprising a dielectric layer disposed between the pixel electrodes and the scan lines.

3. A thin film transistor array, comprising;

a substrate;

a plurality of scan lines, disposed over the substrate;

a plurality of data lines, disposed over the substrate, wherein the substrate is defined into a plurality of pixel areas by the scan lines and the data lines;

a plurality of thin film transistors, connected with the scan lines and the data lines, wherein each thin film transistor is disposed in one of the pixel areas correspondingly;

a plurality of pixel electrodes, wherein each pixel electrode is disposed in one of the pixel areas and is electrically connected to one of the thin film transistors correspondingly; and a plurality of common lines, disposed over the substrate, wherein a storage capacitor is formed between a portion of each pixel electrode located above one of the common lines and the common lines, and one of the common lines and a defect pixel electrode of the pixel electrode have a particle or a defect therebetween, wherein the defect pixel electrode further comprises an opening corresponding to the particle or the defect.

4. The thin film transistor array of claim 3, further comprising a dielectric layer disposed between the pixel electrodes and the common lines.

* * * * *